United States Patent
Seo et al.

(10) Patent No.: US 7,097,916 B2
(45) Date of Patent: Aug. 29, 2006

(54) ORGANIC LIGHT EMITTING ELEMENT AND LIGHT EMITTING DEVICE USING THE ELEMENT

(75) Inventors: Satoshi Seo, Kanagawa (JP); Atsushi Tokuda, Kanagawa (JP); Yasuo Nakamura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/122,134

(22) Filed: Apr. 15, 2002

(65) Prior Publication Data

US 2003/0022019 A1 Jan. 30, 2003

(30) Foreign Application Priority Data

Apr. 13, 2001 (JP) ............................. 2001-116192

(51) Int. Cl.
*H05B 33/14* (2006.01)

(52) U.S. Cl. ................. 428/690; 428/704; 428/917; 313/504; 313/506; 257/40; 257/103; 252/301.16; 252/301.26

(58) Field of Classification Search ............... 428/690, 428/704, 917; 313/504, 506; 257/40, 103; 252/301.16, 301.26
See application file for complete search history.

(56) References Cited

U.S. PATENT DOCUMENTS

| | | | |
|---|---|---|---|
| 6,455,579 B1 * | 9/2002 | Satsuki et al. | 514/457 |
| 6,572,987 B1 * | 6/2003 | Seo | 428/690 |
| 2002/0028347 A1 * | 3/2002 | Marrocco et al. | 428/690 |
| 2002/0051896 A1 | 5/2002 | Seo | |
| 2002/0146589 A1 * | 10/2002 | Akiyama et al. | 428/690 |

FOREIGN PATENT DOCUMENTS

| | | |
|---|---|---|
| JP | 11-031588 | 2/1999 |
| JP | 2000-208262 A | 7/2000 |
| JP | 2002-184582 A | 6/2002 |
| WO | WO-2000/53598 * | 9/2000 |

OTHER PUBLICATIONS

U.S. Appl. No. 60/211, 108.*
Hawley's Condensed Chemical Dictionary, 13th Edition, p. 1147.*
Hawley's Condensed Chemical Dictionary, 13th Edition by Richard J. Lewis, Sr., pp. 296.*
International Search Report, Jan. 28, 2003.
C.W. Tang et al., "Organic Electroluminescent Diodes," Applied Physics Letters, vol. 51, No. 12, Sep. 21, 1987, pp. 913-915.
J. Kido, "Monthly Display Special Issue, Organic EL Display: From the Basics to the Latest News," Techno Times Co., Ltd., 1998, pp. 28-29.
O'Brien et al., "Improved Energy Transfer in Electrophosphorescent Devices," Applied Physics Letters, vol. 74, No. 3, Jan. 18, 1999, pp. 442-444.
Tsutsui et al., "High Quantam Efficiency in Organic Light-Emitting Devices with Iridium Complex as a Triplet Emissive Center," Japanese Journal of Applied Physics, vol. 38, 1999, pp. L1502-L1504.
Baldo et al., "High-Efficiency Fluorescent Organic Light-Emitting Devices Using a Phosphorescent Sensitizer," Nature (London), vol. 403, Feb. 2000, pp. 750-753.
Inoue et al., "Basic Chemistry Course: Photochemistry I," (Maruzen), pp. 74-76, Abst.
Rawlins et al., "A Tungsten Organometallic Complex as a Spectroscopic Probe of Acrylate Polymerization in Thin Films," Polym. Prepr., 1996, pp. 647-648.
Manuta et al., "Emission and Photochemistry of $M(CO)_4$ (diimine) (M=Cr, Mo, W) Complexes in Room-Temperature Solution," Inorg. Chem., 1986, pp. 1354-1359.

* cited by examiner

*Primary Examiner*—Ling Xu
(74) *Attorney, Agent, or Firm*—Eric J. Robinson; Robinson Intellectual Property Law Office, P. C.

(57) ABSTRACT

A chelate complex having as its central metal tungsten which is an inexpensive metal and which is a heavy atom is applied to an organic light emitting element, thereby obtaining an organic light emitting element capable of converting the triplet excitation energy into light emission. By applying the organic light emitting element using this metal complex, an inexpensive light emitting device which is bright but consumes little power can be provided as well as an electric appliance using the light emitting device.

8 Claims, 14 Drawing Sheets

[Fig. 1]
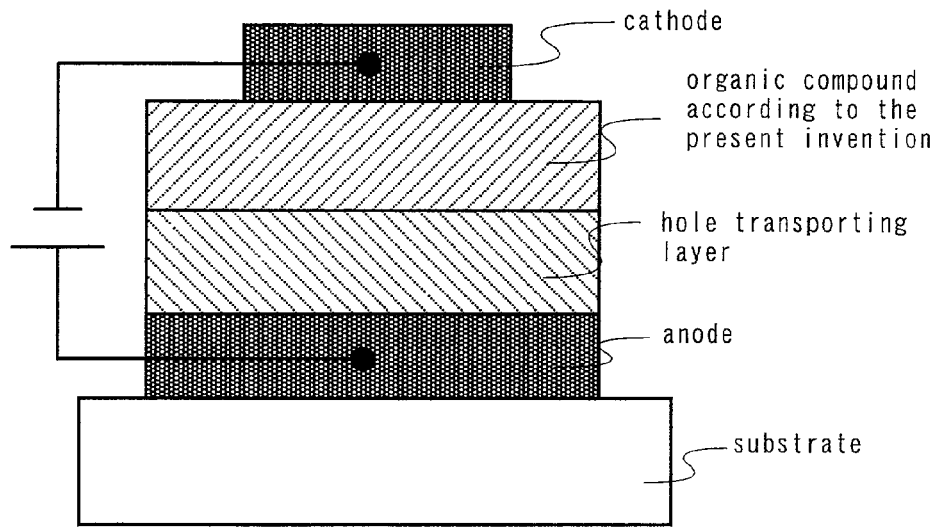
(a)
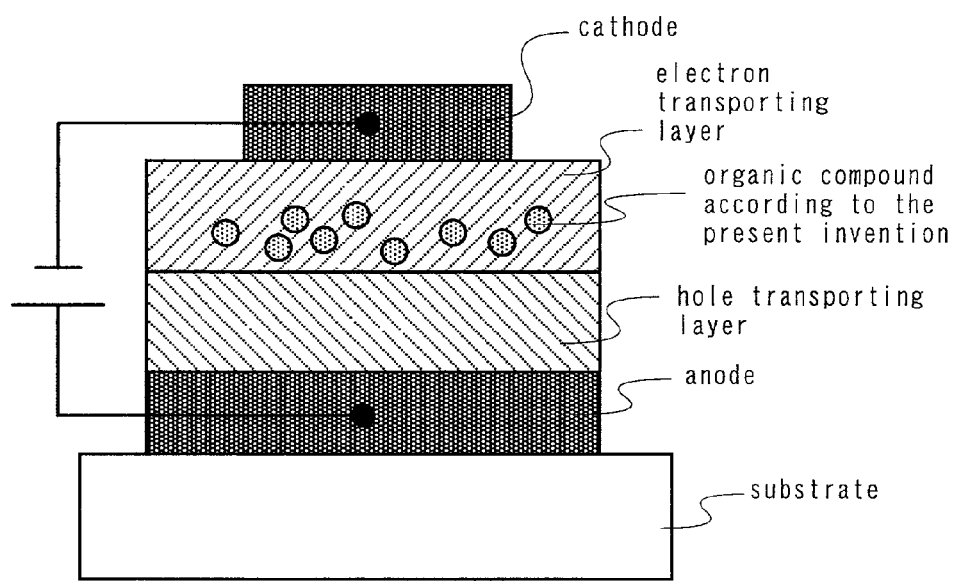
(b)

[Fig. 2]
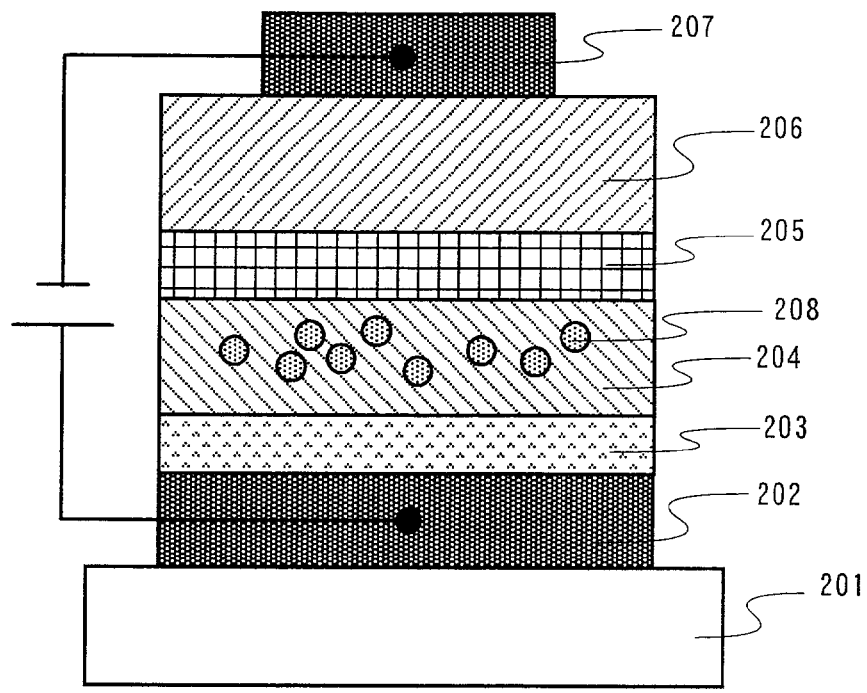
(a)
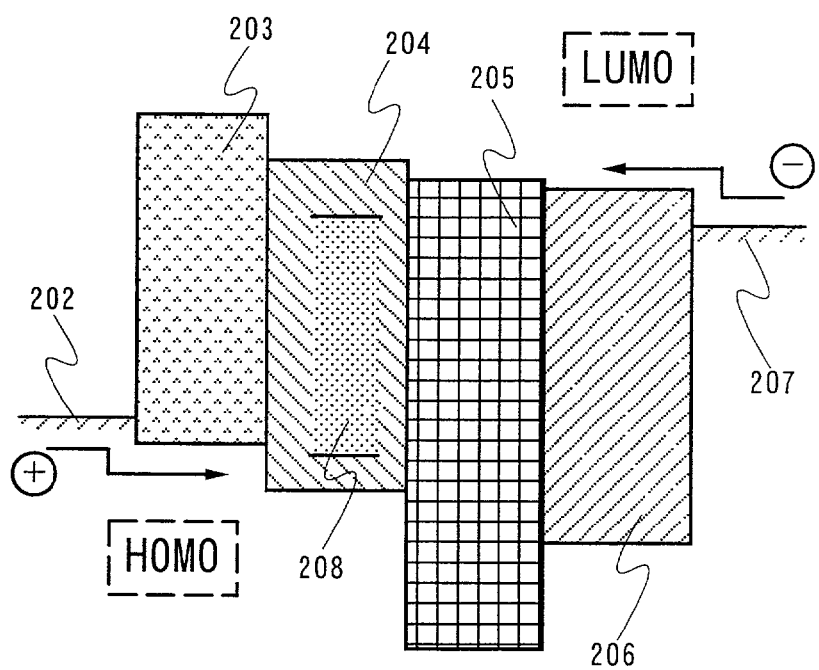
(b)

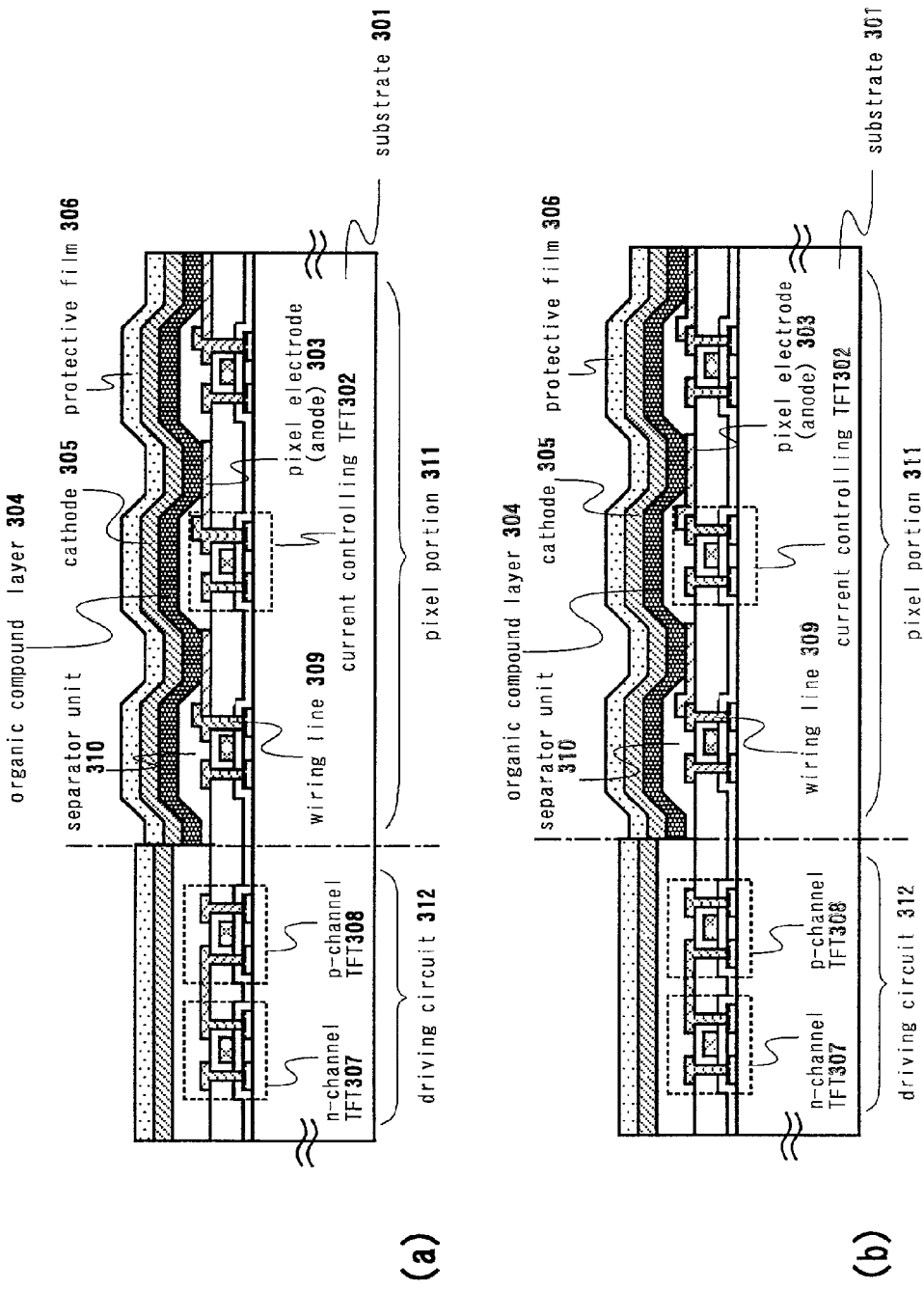

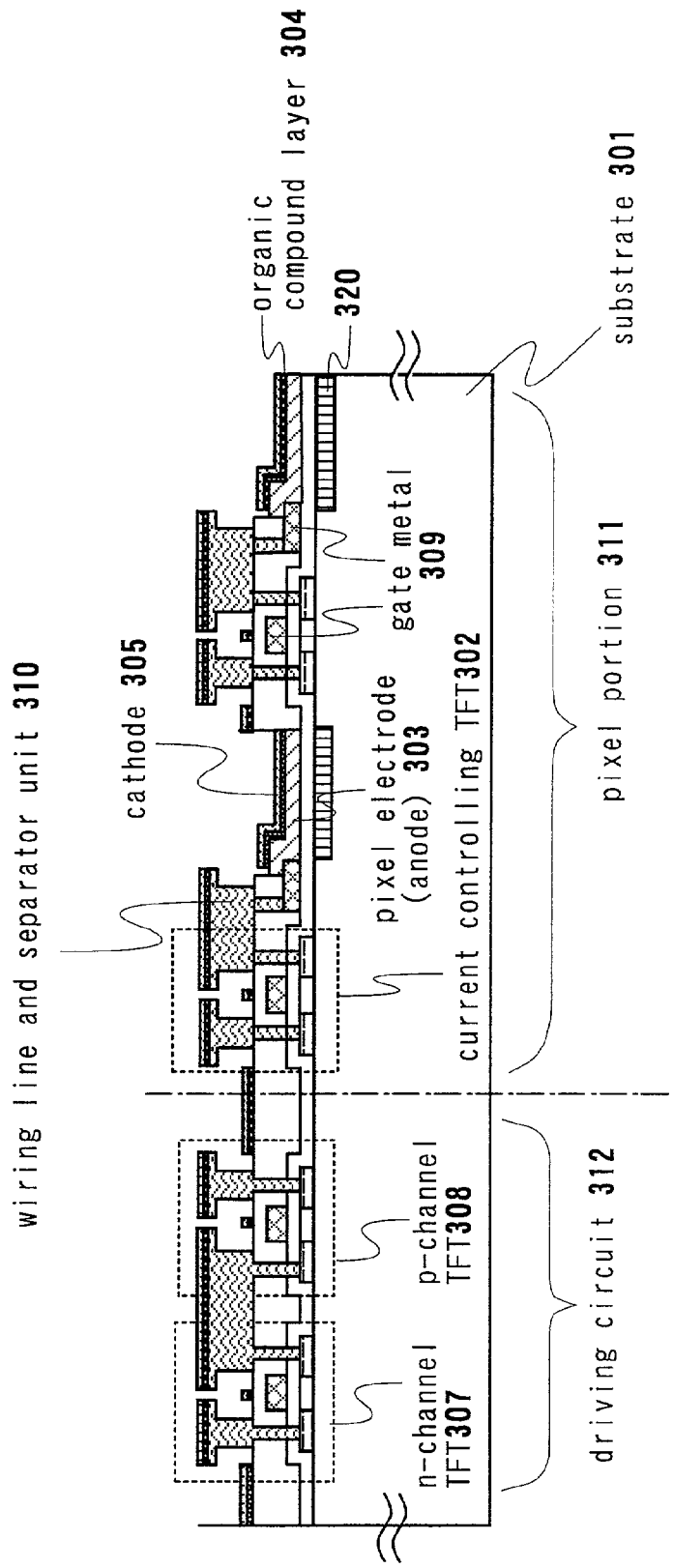
[Fig. 4]

[Fig. 5]
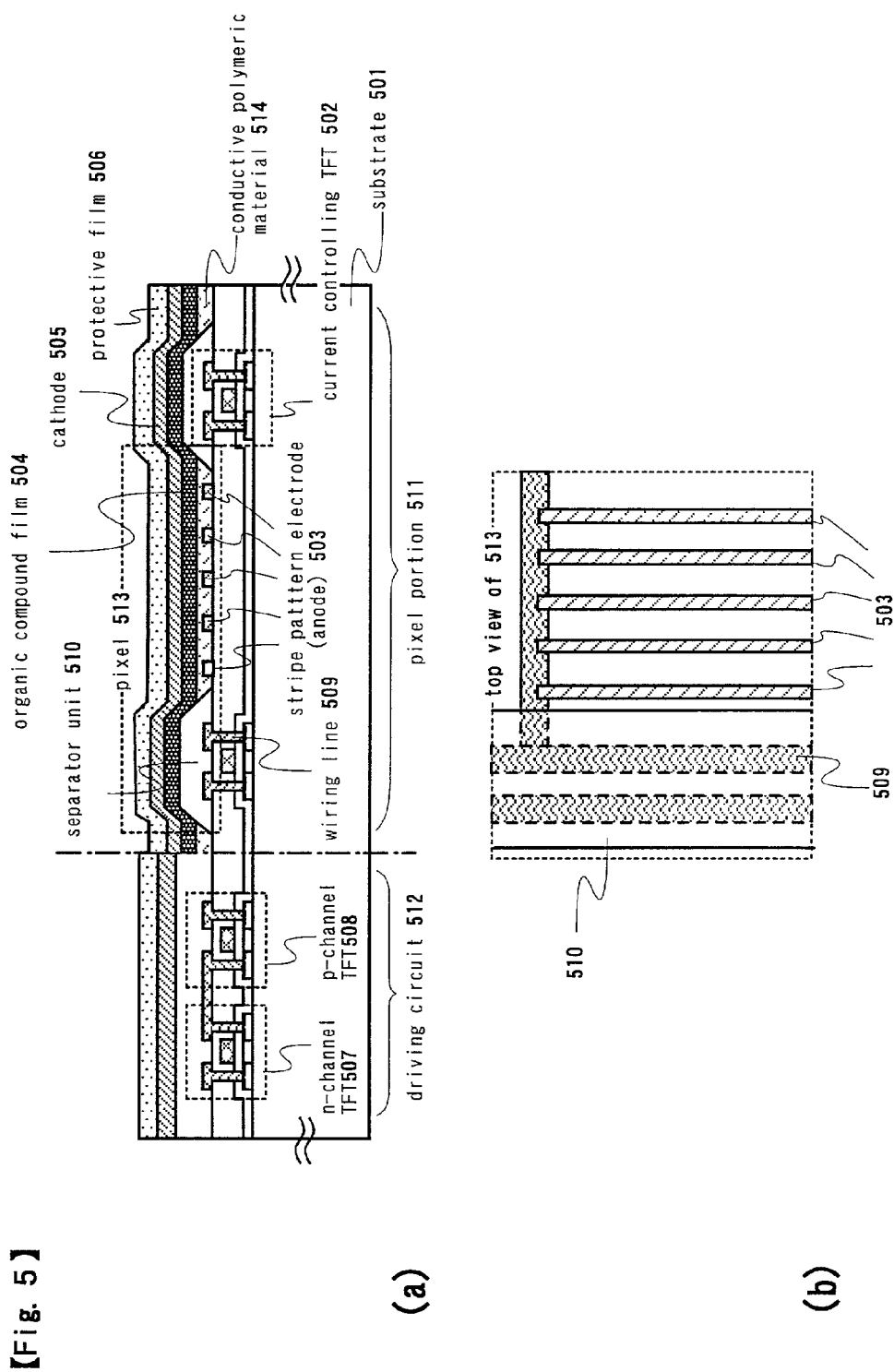
(a)
(b)

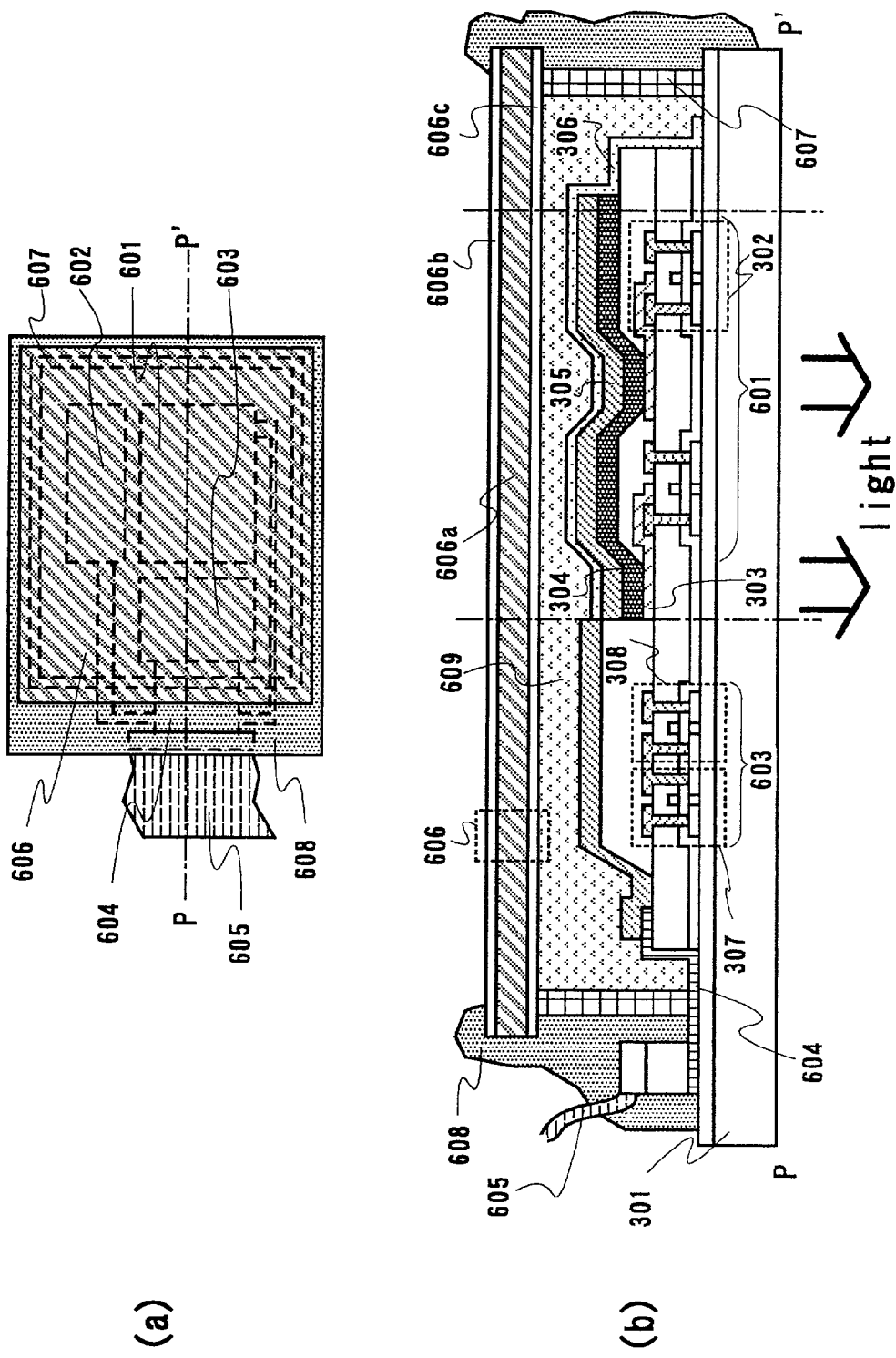

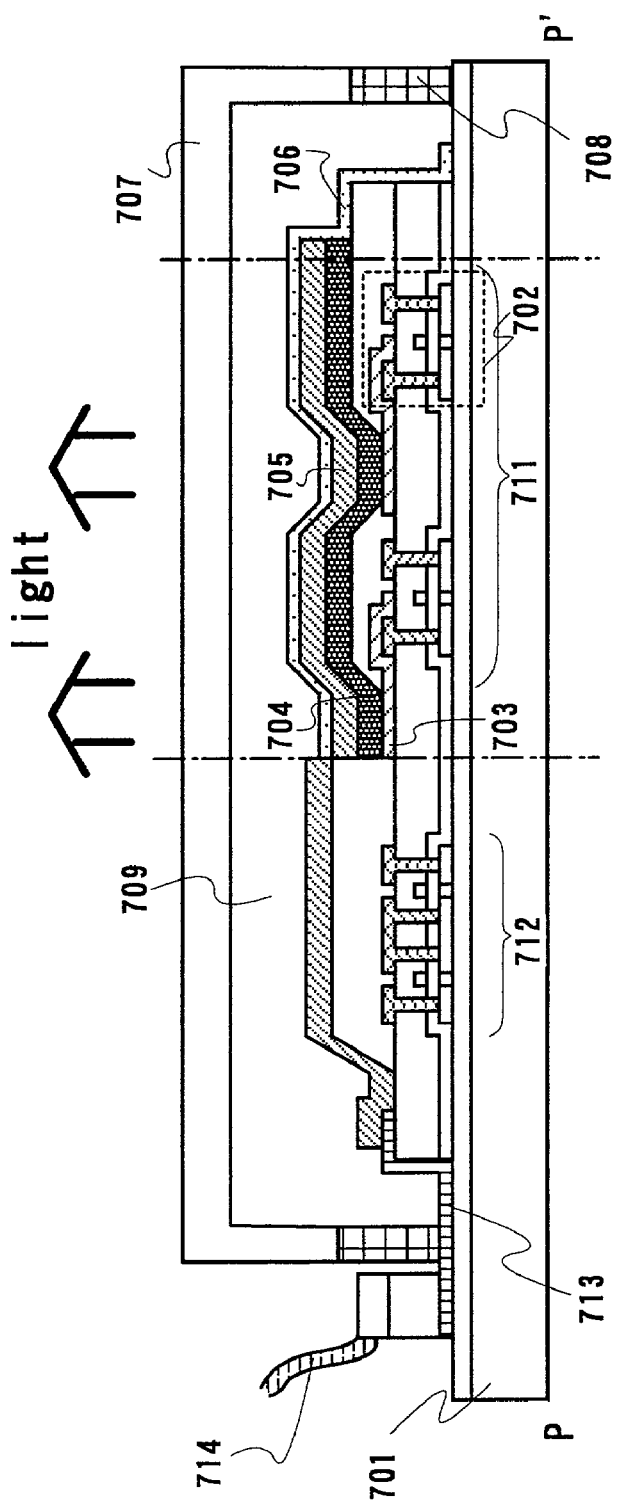

[Fig. 8]
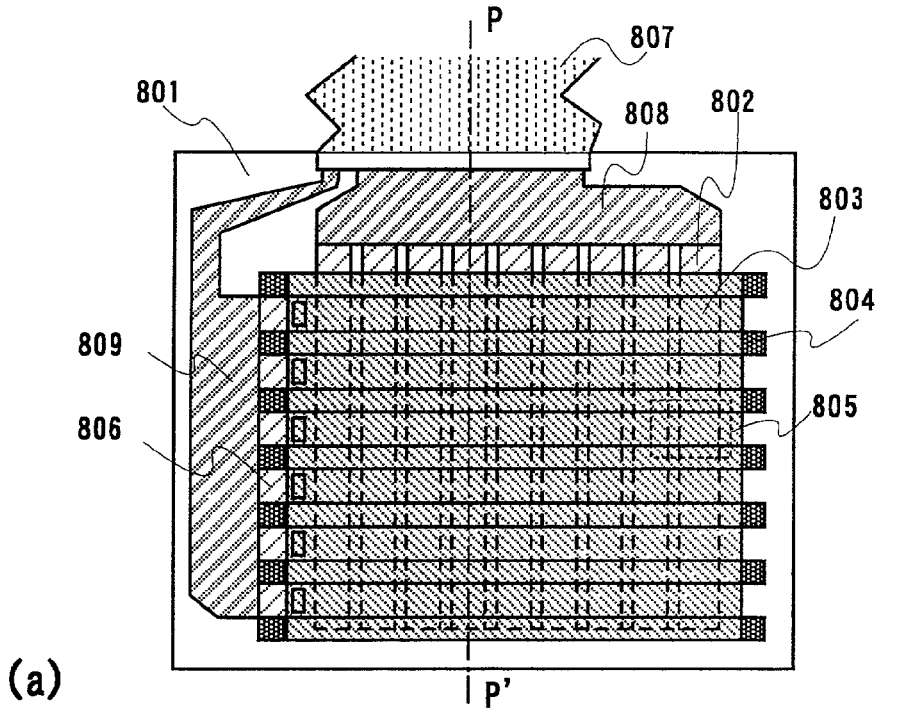
(a)
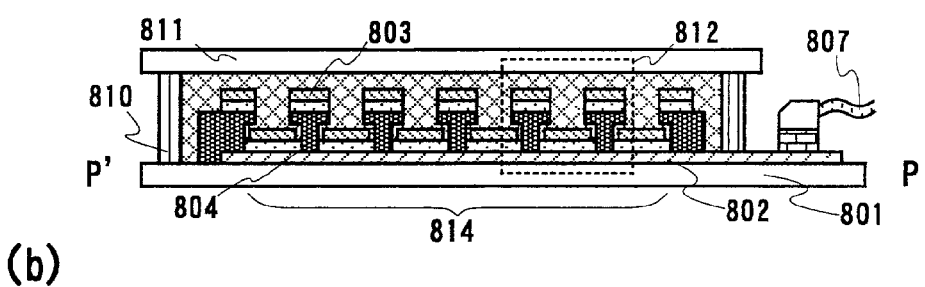
(b)
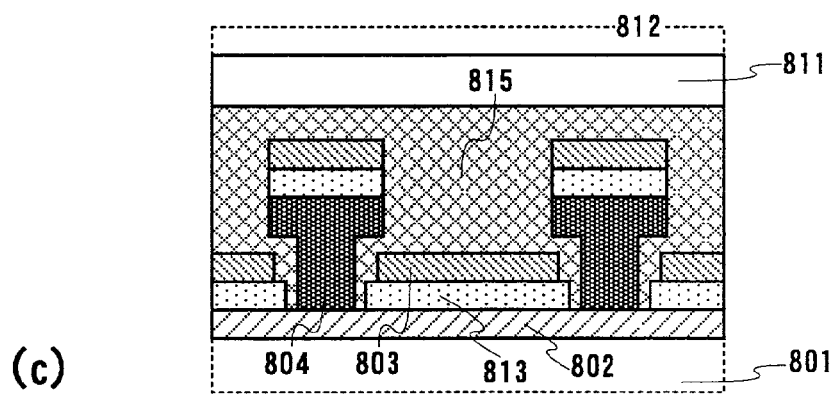
(c)

[Fig. 9]
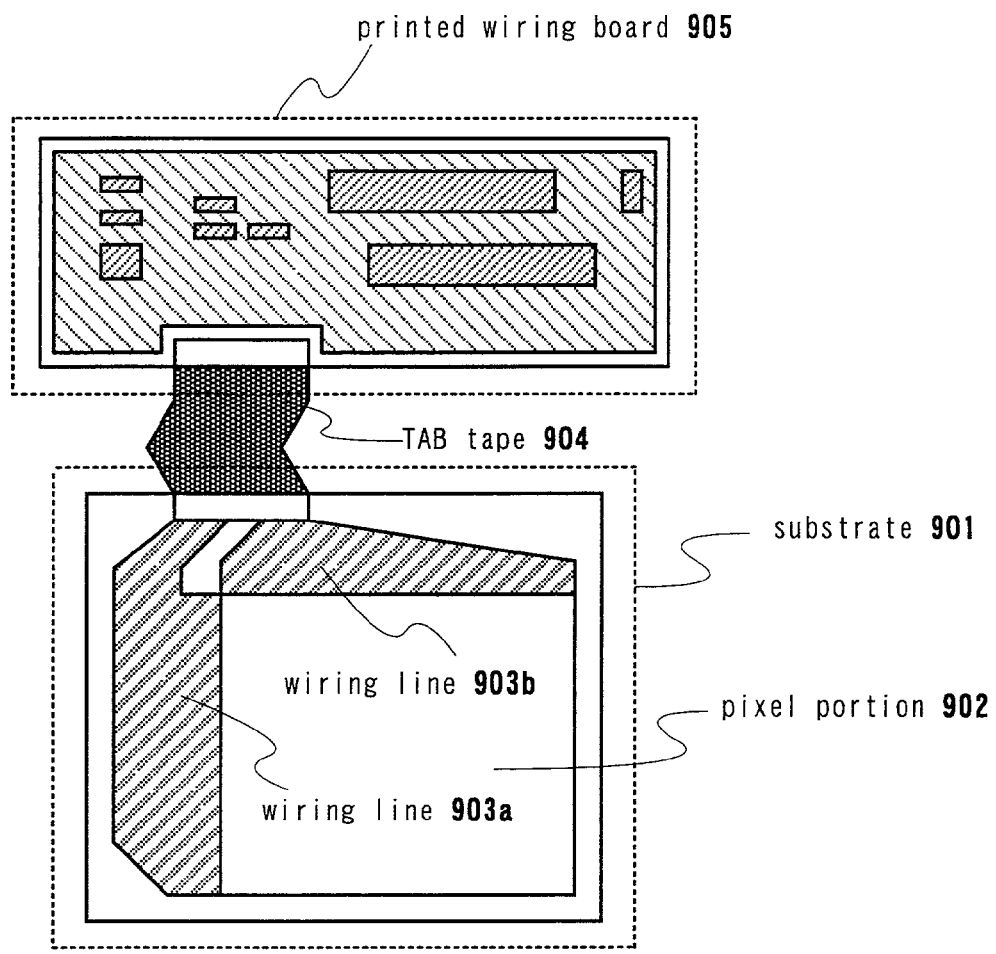
(a)
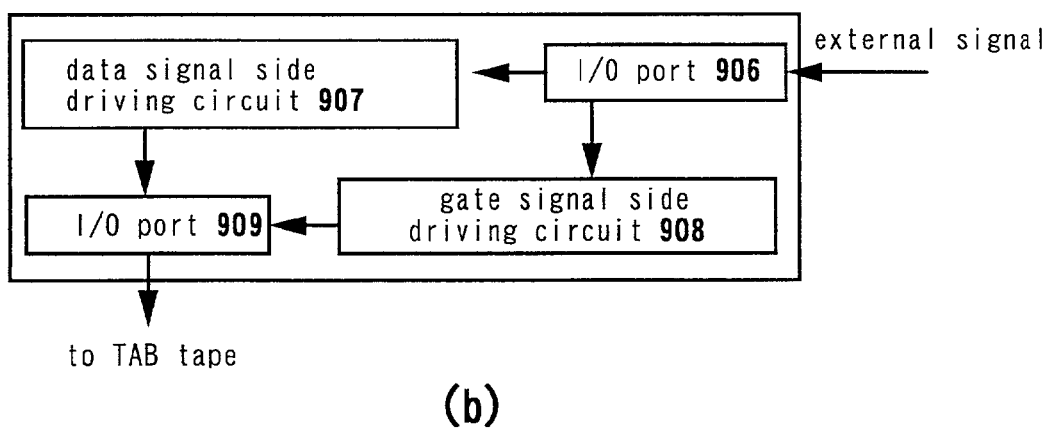
(b)

[Fig. 10]
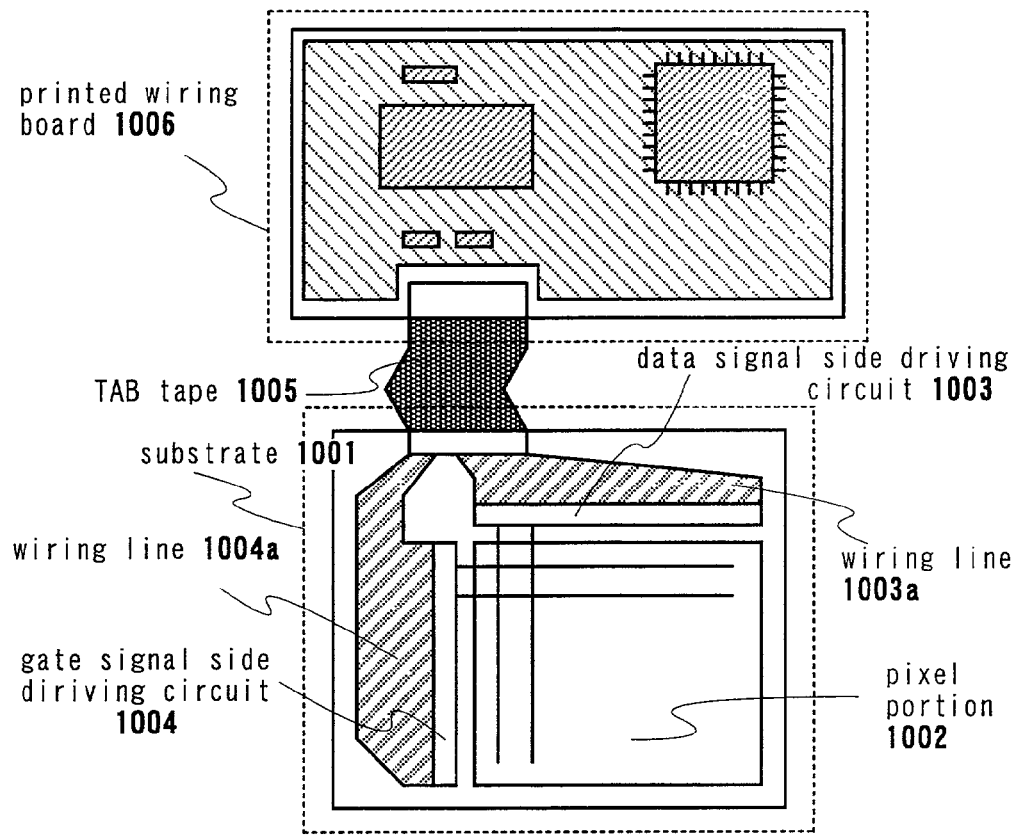
(a)
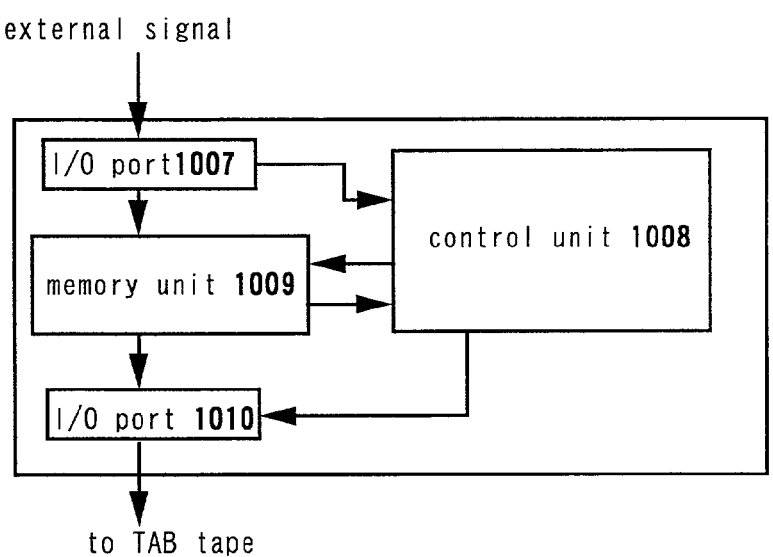
(b)

[Fig.11]
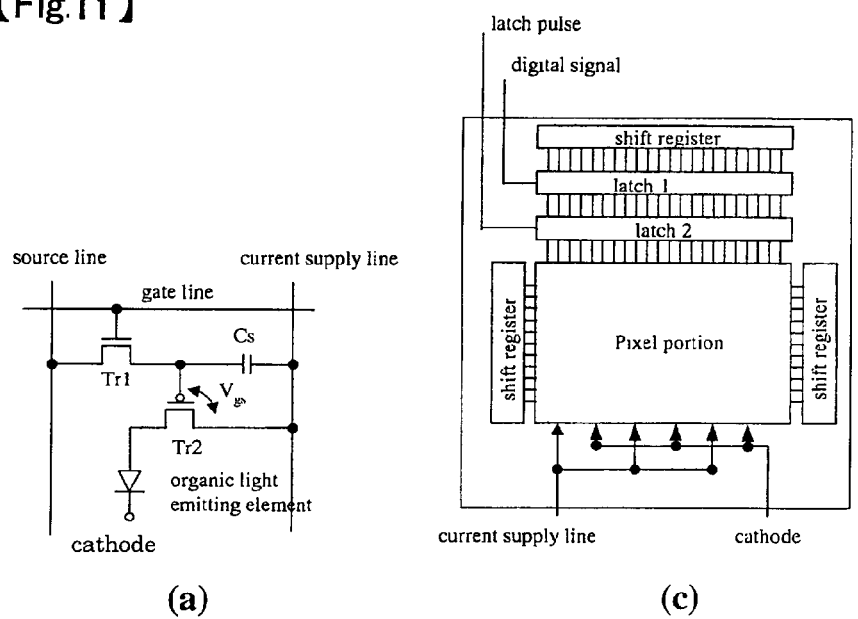
(a)　　　　　　　　　　(c)
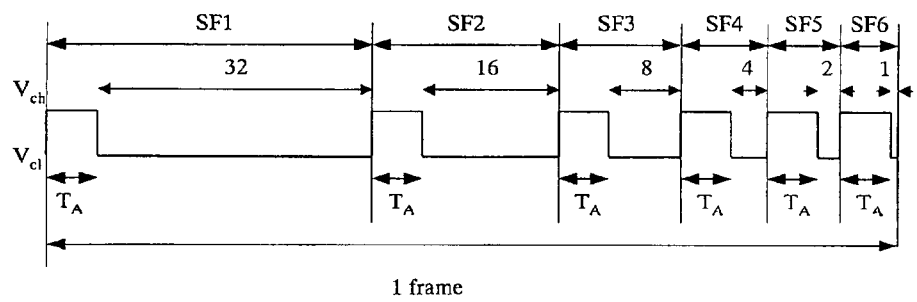
1 frame
SF1-SF6:sub-frame, $T_A$: writing period
(b)

[Fig. 12]
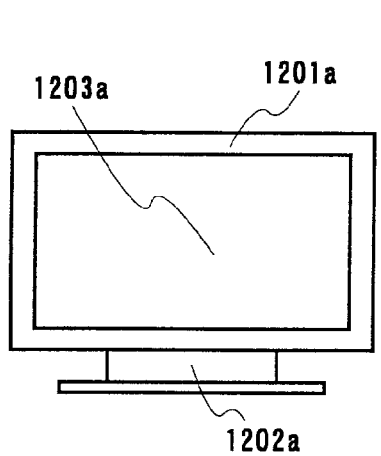
(a)
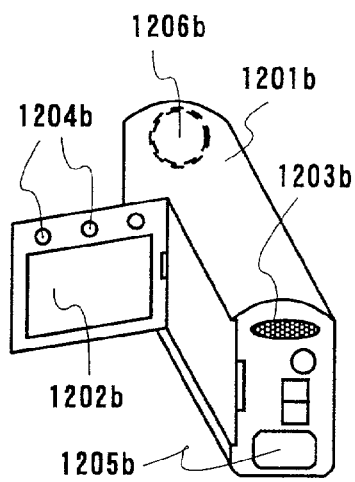
(b)
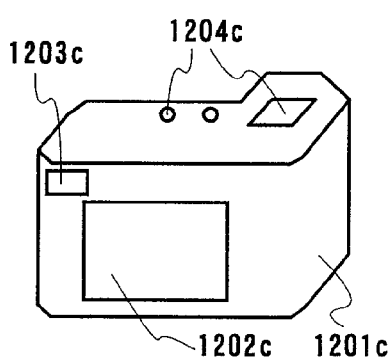
(c)
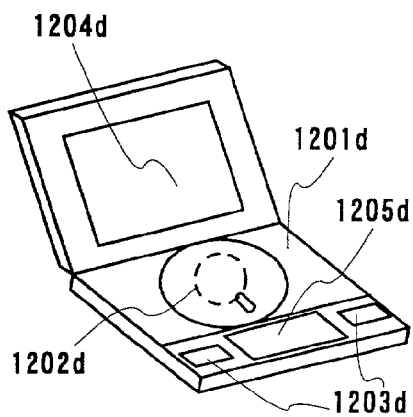
(d)
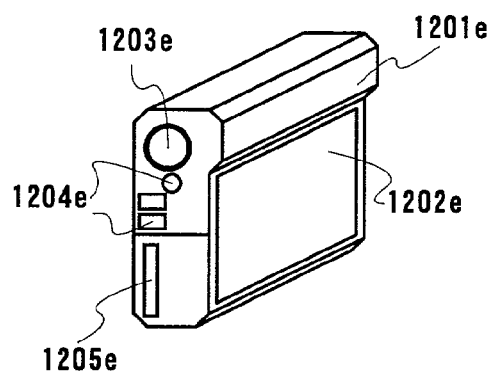
(e)
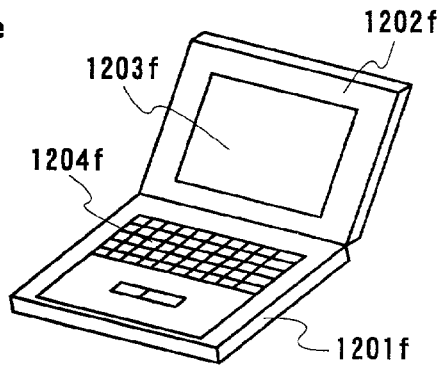
(f)

[Fig. 13]
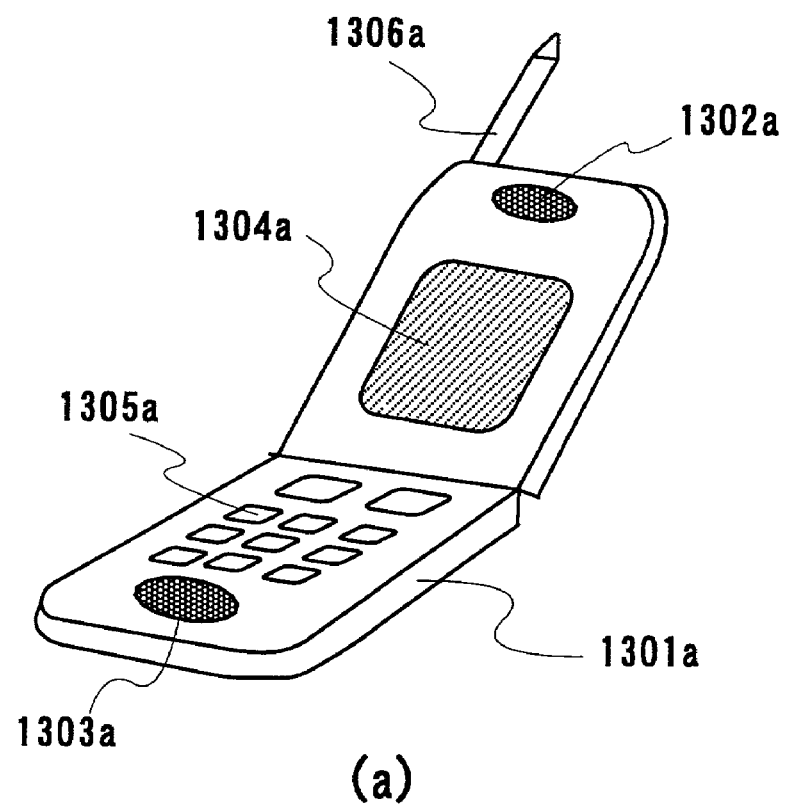
(a)
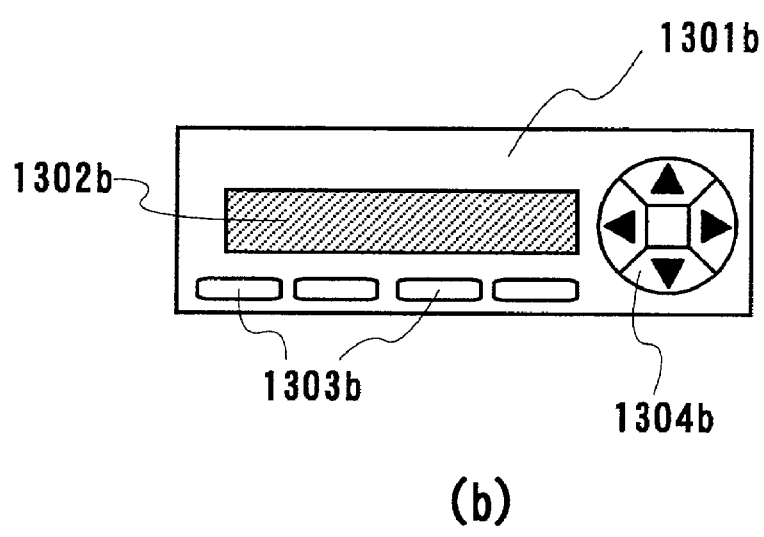
(b)

[Fig.14]
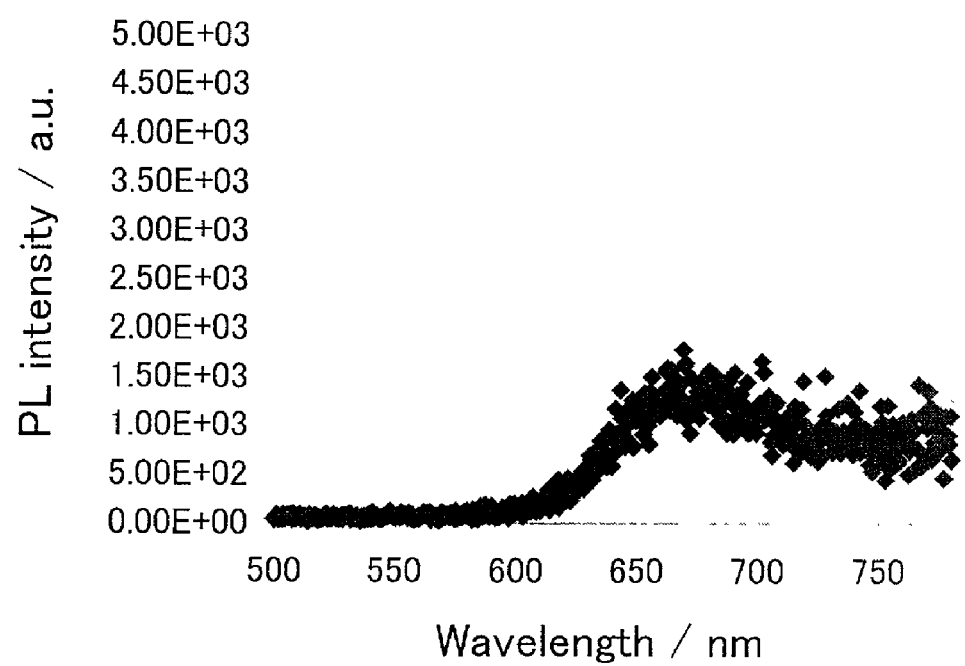

ORGANIC LIGHT EMITTING ELEMENT AND LIGHT EMITTING DEVICE USING THE ELEMENT

BACKGROUND OF THE INVENTION

1. Field to Which the Invention Belongs

The present invention relates to an organic light emitting element having an anode, a cathode, and a layer containing an organic compound that emits light upon application of electric field (hereinafter referred to as "organic compound layer"), and to a light emitting device using the organic light emitting element. In general, light emission obtained from organic compounds by application of electric field is divided into light emission upon return to the base state from singlet excited state (fluorescent light) and light emission upon return to the base state from triplet excited state (phosphorescent light). The present invention relates particularly to an organic light emitting element using an organic compound that can emit phosphorescent light. Note that, in this specification, a light emitting device refers to an image display device that uses an organic light emitting element as its light emitting element. Also, the following modules are all included in the definition of the light emitting device: a module obtained by attaching to an organic light emitting element a connector such as an anisotropic conductive film (FPC: flexible printed circuit), a TAB (tape automated bonding) tape, or a TCP (tape carrier package); a module in which a printed wiring board is provided at an end of the TAB tape or TCP; and a module in which an IC (integrated circuit) is directly mounted to an organic light emitting element by the COG (chip on glass) method.

2. Prior Art

Organic light emitting elements are elements that emit light upon application of electric field. It is said that organic light emitting elements emit light through the following mechanism: a voltage is applied between electrodes that sandwich an organic compound layer, electrons injected from the cathode and holes injected from the anode are re-combined in the organic compound layer to form excited molecules (hereinafter referred to as "molecular excitons"), and the molecular excitons return to the base state while releasing energy to cause the organic light emitting element to emit light.

In an organic light emitting element as above, its organic compound layer is usually a thin film of sub-micron level. In addition, the organic light emitting element does not need back light used in conventional liquid crystal displays because it is such a self-luminous element that the organic compound layer itself emits light. The organic light emitting element is therefore useful in manufacturing a very thin and light-weight device, which is a great advantage.

When the organic compound layer is about 100 to 200 nm in thickness, for example, recombination takes place within several tens nanoseconds or so since carriers are injected based on the mobility of carriers in the organic compound layer and, counting the process from carrier recombination to light emission, the organic light emitting element is readied for light emission in order of equal to or less than microseconds. Accordingly, fast response is also one of the features of the organic light emitting element.

Furthermore, since the organic light emitting element is of carrier injection type, it can be driven with direct-current voltage and hardly produces noises. Regarding drive voltage, a report says that a sufficient luminance of 100 cd/m² is obtained at 5.5 V by using a very thin film with a uniform thickness of about 100 nm for the organic compound layer, choosing an electrode material capable of lowering a carrier injection barrier against the organic compound layer, and introducing the hetero structure (two-layer structure). (Reference 1: C. W. Tang and S. A. VanSlyke, "Organic electroluminescent diodes", Applied Physics Letters, Vol. 51, No. 12, 913–915 (1987))

Organic light emitting elements are drawing attention as the next-generation flat panel display elements for their characteristics including being thin and light-weight, fast response, and direct-current low-voltage driving. Also, being self-luminous and having wide viewing angle give the organic light emitting elements better visibility. Therefore the organic light emitting elements are considered as effective elements for display screens of portable equipment.

By the way, as mentioned above, light emission in organic light emitting elements is a phenomenon that is generated at the time when molecular excitons return to the base state. However, the types of molecular excitons of organic compounds may include a singlet excited state (S*) and a triplet excited state (T*). The statistical ratio of generation of the two states in organic light emitting elements is considered as S*:T*=1:3 (Reference 2: Junji Kido, "Monthly Display Special Issue, Organic EL Display: From the Basics to the Latest News", Techno Times Co., Ltd., p. 28–29).

However, in case of general organic compounds, light emission (phosphorescent light) from the triplet excited state (T*) at room temperature is not observed, and it is usually observed only light emission (fluorescent light) from the singlet excited state (S*). This is because the base state of organic compounds is normally the singlet base state (So), and therefore the transition from T* to So is a highly spin forbidden transition, whereas the transition from S* to So is a spin allowed transition.

Accordingly, only singlet excited state (S*) usually contributes to light emission and this applies to organic light emitting elements, too. Thus, the theoretical limit of the internal quantum efficiency (the ratio of photons generated to the amount of carriers injected) in organic light emitting elements, which is calculated based on S*:T*=1:3, is therefore 25%.

Not all of light generated reach outside. A part of light generated cannot be taken out due to the refractive index innate to materials constituting the organic light emitting element (organic compound layer materials and electrode materials) and to the material of the substrate. The ratio of light that is taken out to all of the light generated is called the efficiency of taking light out. The efficiency of taking light out is said to be around 20% in organic light emitting elements that have glass substrates.

From the above reasons, it has been said that the theoretical limit of the final ratio of photons that can be taken out to the number of carriers injected (hereinafter referred to as "external quantum efficiency") is 25%×20%=5% even if all of the injected carriers form molecular excitons. In short, only 5% of re-combined carriers are taken out as light even when all of the carriers are re-combined.

In recent years, however, organic light emitting elements that can convert energy released when returning to the base state from triplet excited state (T*) (hereinafter referred to as "triplet excitation state energy) into light emission have been published one after another and their high light emission efficiency is attracting attention. (Reference 3: D. F. O'Brien, M. A. Baldo. M. E. Thompson and S. R. Forrest, "Improved energy transfer in electrophosphorescent devices", Applied Physics Letters, Vol. 74, No. 3, 442–444 (1999)) (Reference 4: Tetsuo TSUTSUI, Moon-Jae YANG, Masayuki YAHIRO, Kenji NAKAMURA, Teruichi WATANABE, Taishi TSUJI, Yoshinori FUKUDA, Takeo WAKIMOTO and Satoshi MIYAGUCHI. "High Quantum Efficiency in Organic Light-Emitting Devices with Iridium-Complex as a Triplet Emissive Center", Japanese Journal of Applied Physics. Vol. 38, pp. L1502–L1504 (1999))

In Reference 3, a metal complex having platinum as its central metal (hereinafter referred to as "platinum complex") is used and Reference 4 employs an organic metal complex having iridium as its central metal (hereinafter referred to as "iridium complex"). Both complexes are characterized in that a third transition series element is introduced as the central metal. Some of them easily exceed the aforementioned theoretical limit value of the external quantum efficiency of 5%.

If layers formed of an iridium complex and layers formed of DCM2 that is a known fluorescent pigment are alternately layered, the triplet excitation energy generated by the iridium complex can be transferred to DCM2 to contribute to light emission of DCM2. (Reference 5: M. A. Baldo, M. E. Thompson and S. R. Forrest, "High-efficiency fluorescent organic light-emitting devices using a phosphorescent sensitizer", Nature (London), Vol. 403, 750–753 (2000)). DCM2 emits light from singlet excited state (fluorescent light). However, the triplet excitation energy generated by the iridium complex with high efficiency is utilized for the singlet excitation energy of other molecule, namely, DCM2, thereby improving the efficiency.

As shown in Reference 3 to 5, organic light emitting elements using organic compounds that can convert the triplet excitation energy to light emission (hereinafter referred to as "triplet light emission materials") can achieve higher external quantum efficiency than conventional ones. As the external quantum efficiency is raised, the luminance of emitted light is improved. Accordingly, organic light emitting elements using triplet light emission materials will take up a great portion in future development of light emitting elements as measures for achieving high luminance light emission and high efficiency light emission.

However, platinum and iridium are both so-called precious metals, and therefore a platinum complex and iridium complex using those are also expensive. This is expected to hinder reduction of cost in future. In addition, platinum and iridium are rare metals and there will be difficulties in supplying them in mass production.

The iridium complex emits light of green color, namely, light of an intermediate wavelength in the visible light range. The platinum complex, when used as a dopant, causes the element to emit light in red with relatively good color purity. However, if the concentration of the platinum complex is low, its host material also emits light to degrade the color purity and, if the concentration is high, the light emission efficiency is lowered because of concentration quenching. In short, no one has succeeded in obtaining red light and blue light of high color purity at high light emission efficiency from organic light emitting elements that can convert the triplet excitation energy into light emission.

Furthermore, the iridium complex does not have high productivity because it is an organic metal complex in which the central metal is directly σ-coupled to a benzene ring serving as a ligand, and the synthesis takes time and the yield is poor. A Werner complex, such as tris(8-quinolinolate) aluminum (hereinafter referred to as "Alq$_3$") that is often used in organic light emitting elements, is generally considered as more effective from the view point of productivity.

To manufacture full-color flat panel displays using elements that emit red light, green light, and blue light in future, it is necessary to mass-produce materials which have as high external quantum efficiency as the platinum complex and iridium complex and which emit light of excellent color purity from less expensive row materials.

Due to the circumstances described above, it is inevitable to develop triplet light emission materials, other than the existing platinum complex and iridium complex.

SUMMARY OF THE INVENTION

An object of the present invention is therefore to provide a triplet light emission material at lower cost than prior art. Another object of the present invention is to provide an organic light emitting element which has higher light emission efficiency and which is less expensive to manufacture than prior art using the triplet light emission material.

Still another object of the present invention is to provide an inexpensive light emitting device which is bright but consumes little power using the organic light emitting element with high light emission efficiency, which is obtained by carrying out the present invention, and to provide an electric appliance using the light emitting device.

As a result of extensive investigations, the present inventors have thought of attaining the above objects by using a tungsten complex that emits phosphorescent light.

According to the present invention, an organic light emitting element is characterized by comprising an anode, a cathode, and an organic compound layer that is sandwiched between the anode and the cathode, characterized in that the organic compound layer contains a metal complex which has a chelate ligand including an aromatic ring and which has tungsten as its central metal.

For example, an organic light emitting element is characterized in that the metal complex includes a structure expressed by the following general formula (1):

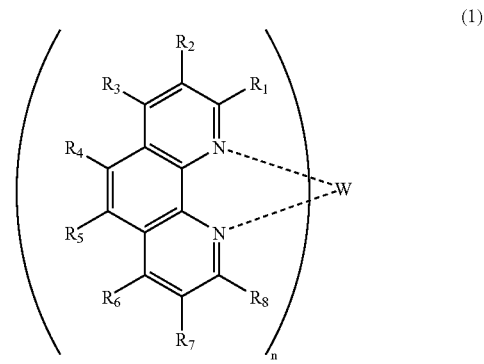

(1)

wherein R1 to R8 each represent a hydrogen atom, a halogen atom, an alkyl group, an alkoxyl group, or an aryl group, and n represents an integer ranging from 1 to 4.

Also, an organic light emitting element is characterized in that the metal complex includes a structure expressed by the following general formula (2):

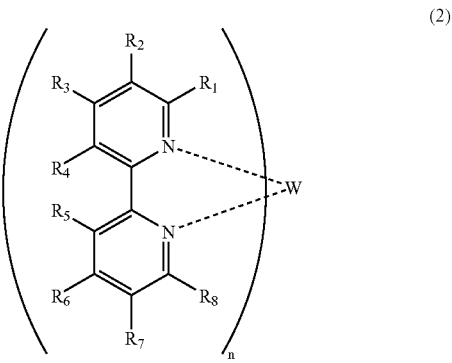

(2)

wherein R1 to R8 each represent a hydrogen atom, a halogen atom, an alkyl group, an alkoxyl group, or an aryl group, and n represents an integer ranging from 1 to 4.

Note that, from the view point of phosphorescent light emission, a tungsten atom is preferably zero-valent in these metal complexes.

According to the structure of the element, the organic light emitting element is characterized in that the metal complex is used as a dopant for the organic compound layer.

By applying organic light emitting elements that use these metal complexes, an inexpensive light emitting device which is bright but consumes little power and an electric appliance having the light emitting device can be provided. Accordingly, a light emitting device and electric appliance using the above organic light emitting elements are included in the present invention.

BRIEF DESCRIPTION OF THE DRAWINGS

FIGS. 1(a) and 1(b) are diagrams showing structures of organic light emitting elements.

FIGS. 2(a) and 2(b) are diagrams showing a structure of an organic light emitting element.

FIGS. 3(a) and 3(b) are diagrams showing sectional structures of light emitting devices.

FIG. 4 is a diagram showing a sectional structure of a light emitting device.

FIGS. 5(a) and 5(b) are diagrams showing a sectional structure of a light emitting device.

FIGS. 6(a) and 6(b) are diagrams showing a top structure and sectional structure of a light emitting device.

FIG. 7 is a diagram showing a top structure and sectional structure of a light emitting device.

FIGS. 8(a), 8(b) and 8(c) are diagrams showing a top structure and sectional structure of a light emitting device.

FIGS. 9(a) and 9(b) are diagrams showing a structure of a light emitting device.

FIGS. 10(a) and 10(b) are diagrams showing a structure of a light emitting device.

FIGS. 11(a), 11(b) and 11(c) are diagrams showing a structure of a light emitting device.

FIGS. 12(a)–(f) are diagrams showing specific examples of electric appliance.

FIGS. 13(a) and (b) are diagrams showing specific examples of electric appliance.

FIG. 14 is a diagram showing a light emission spectrum.

DETAILED DESCRIPTION OF THE PREFERRED EMBODIMENTS

1. Embodiment Mode of the Invention

The present inventors have taken notice of the heavy atom effect known in the field of PL (photo luminescence: luminescence with light as the excitation source). The heavy atom effect is a phenomenon in which the spin-orbit interaction is increased to accelerate interargument crossing (S*→T*) and phosphorescent light emission (T*→So) which are forbidden transitions, by introducing a heavy atom into a molecule of a luminous substance or by putting a heavy atom in surroundings of a luminous substance such as a solvent having the luminous substance dissolved therein. Here, a heavy atom refers to an atom that has a large atomic nucleus load (corresponding to the atomic number, namely, the number of positive electric charges of the atomic nucleus).

The power of the heavy atom effect is determined by the spin-orbit coupling constant (the constant is larger for a heavier atom) unique to each species of atom. From this, it is inferred that there are only a limited variety of atoms that can be used to induce the heavy atom effect. Specifically, desirable atoms are the third transition series elements such as platinum and iridium, and the subsequent atoms. In this aspect, the platinum complex and iridium complex mentioned above are effective triplet light emission materials, but many of the heavy metals such as platinum and iridium are generally expensive.

Accordingly, first, the present inventors have focused attention on tungsten as a heavy atom. The tungsten content of the earth is the highest among the transition metals belonging to the third transition series elements. This makes tungsten an inexpensive metal and suitable for the present invention.

In addition, the atomic number of tungsten, 74, is close to the atomic number of platinum, 78, and the atomic number of iridium, 77, and therefore it is highly probable that tungsten will exert as strong heavy atom effect as platinum and iridium. In fact, in a transition metal carbonyl complex $M(CO)_5(NH(C_2H_5)_2)$ (M=Cr, Mo, W), acceleration of interargument crossing ($S_1 \rightarrow T_1$) and phosphorescent light emission ($T_1 \rightarrow S_o$) by the heavy atom effect is observed only when the central metal M is tungsten (Reference 6: Haruo Inoue, Katsuhiko Takagi, Masako Sasaki, Sho Shin Pak, "Basic Chemistry Course: Photochemistry I" (Maruzen), p. 74–76).

Next, a ligand for tungsten as the central metal has to be considered. A metal complex containing tungsten (hereinafter referred to as "tungsten complex") according to the present invention is used in an organic light emitting element and therefore has to be stable electrically and chemically. Also it is desirable for the tungsten complex to have as much ability of transporting carriers as possible.

From these view points, a chelate ligand is considered as a preferable ligand. Compared to a unidentate coordination as in the carbonyl complex of Reference 6, forming a chelate ring is a more effective way to stabilize a complex (chelate effect). Some of ligands that can form chelate ring have aromatic rings (namely, aromatic compounds) and a metal complex using those ligands is often capable of transporting carriers. This is another reason of employing a chelate ligand.

Based on the above, the present invention applies to an organic light emitting element a metal complex which has tungsten as its central metal and which has a chelate ligand including an aromatic ring.

A zero-valent tungsten complex to which a phenanthroline ligand is introduced is known as a tungsten complex which has an aromatic ring chelate ligand and which emits phosphorescent light. (Reference 7: Kathleen A. Rawlins and Alistair Lees, "A TUNGSTEN ORGANOMETALLIC COMPLEX AS A SPECTROSCOPIC PROBE OF ACRYLATE POLYMERIZATION IN THIN FILM", Polym. Prepr., 647–648 (1996)). Therefore, the present invention employs a tungsten complex that includes a structure expressed by the general formula (1).

However, the complex in Reference 7 has only one phenanthroline ligand and other ligands are carbonyl. The complex is not stable unless it is modified and therefore the present invention prefers one obtained by replacing these carbonyl ligands with other chelate ligands. An example of this complex is a tungsten complex expressed by the following formula (3).

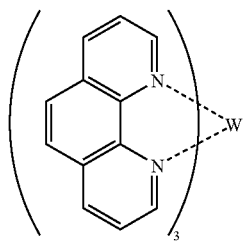

(3)

A complex using 2,2'-bipyridil as a similar ligand can also be employed. This is a tungsten complex that includes a structure expressed by the general formula (2). An example of this complex is a tungsten complex expressed by the following formula (4).

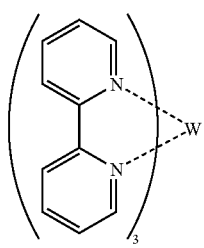

(4)

In the above examples, Werner complexes are used because of easiness in synthesizing and excellent productivity. However, characteristics are improved more when using an organic metal complex in which the central metal is directly coupled with a carbon atom serving as a ligand. This is true particularly for the iridium complex.

Described next are modes of manufacturing an organic light emitting element. When an organic compound according to the present invention is used as a light emission material of an organic light emitting element, the use thereof is roughly divided into two types. One is to use the compound for a light emitting layer as typified in FIG. 1(a). The other is to use the compound as a dopant as typified in FIG. 1(b).

In FIG. 1(a), an organic compound according to the present invention is used in an electron transporting light emitting layer (single hetero structure). Alternatively, the compound may form a light emitting layer between a hole transporting layer and an electron transporting layer (double hetero structure). In FIG. 1(b), an organic compound according to the present invention is used to dope an electron transporting layer. Alternatively, a hole transporting layer may be doped with the organic compound. An anode is formed on a substrate in FIGS. 1(a) and 1(b) but instead a cathode may be placed on the substrate.

If various substituents are introduced to a tungsten complex according to the present invention, the ability of transporting carriers may be degraded. In that case, using the complex as a dopant as in FIG. 1(b) is preferred to using the complex for a light emitting layer as in FIG. 1(a).

An inorganic compound may be introduced to an organic light emitting element. For example, an inorganic compound can be introduced to form a hole injection layer that is in contact with an anode or to form an electron injection layer that is in contact with a cathode.

Embodiment 1

In this embodiment, a tungsten complex expressed by the general formula (1) is synthesized and the light emission spectrum thereof is checked. For the synthesizing method, Reference 8 is consulted. (Reference 8: David M. Manuta and Alistair J. Lee. "Emission and Photochemistry of M(CO)4(diimine) (M=Cr, Mo, W) Complexes in Room-Temperature Solution", Inorg. Chem., 1354–1359 (1986)).

The light emission spectrum (photoluminescence) thereof is shown in FIG. 14. Light emission in reddish violet is observed in the spectrum and is recognized as phosphorescent light owing to the heavy atom effect of tungsten.

Embodiment 2

The organic compound synthesized in Embodiment 1, for example, can be used for a light emitting layer or as a dopant of a light emitting layer in an organic light emitting element. However, as described before, it is preferred to use the compound as a dopant considering that various substituents are to be introduced to the compound. This embodiment shows an element structure when the compound is used as a dopant.

FIGS. 2(a) and 2(b) show a typical element structure and band diagram thereof. Shown in FIG. 2(a) is the element structure in which an anode 202, a hole injection layer 203, a hole transporting layer 204, a hole blocking layer 205, an electron transporting layer 206, and a cathode 207 are layered in order on a substrate 201. An organic compound of the present invention is used as a dopant 208 to dope the hole transporting layer 204. The substrate is in contact with the anode in this structure, but the substrate may be in contact with the cathode instead.

In this case, as shown in the band diagram of FIG. 2(b), the organic compound of the present invention (the dopant 208 in FIGS. 2(a) and 2(b)) has to be higher in HOMO level and lower in LUMO level than the host material (the hole transporting layer 204 in FIGS. 2(a) and 2(b)). Preferably, the light emission spectrum of the host material overlaps the absorption spectrum of the organic compound of the present invention to enhance the efficiency. Although this embodiment uses the organic compound of the present invention to dope the hole transporting layer, the electron transporting layer or the light emitting layer may be doped with the organic compound.

Now, specifics of the element shown in FIG. 2(a) are described. First, indium tin oxide (ITO) is formed into a film as the anode 202 on the glass substrate 201 by sputtering. Then an aqueous solution of polyethylene dioxythiophene (hereinafter referred to as "PEDOT") doped with polystyrene sulfonic acid (hereinafter referred to as "PSS") is formed into a film by spin coating. The film is baked to form the hole injection layer 203.

poly(N-vinyl carbazole) (hereinafter referred to as "PVK"), which has a large excitation energy and therefore is versatile as a host, is used for the hole transporting layer 204. Accordingly, PVK and an alkyl-substituted (for the purpose of improving the solubility) compound of one of the general formulae (1) through (6), which serves as the dopant 208, are dissolved in the same solvent and the solution is formed into a film by spin coating.

Next, 3-(4-tert-butylphenyl)-4-phenyl-5-(4-biphenylyl)-1,2,4-triazole (hereinafter referred to as "TAZ") is formed into a film as the hole blocking layer 205 by vacuum evaporation in order to raise the ratio of recombination of carriers in the hole transporting layer 204. Then, Alq$_3$ is formed into a film as the electron transporting layer 206 by vacuum evaporation. Lastly, an Al:Li alloy is formed into a film by vacuum evaporation to obtain the cathode 207.

An organic EL element can be manufactured by dispersing an organic compound of the present invention in a polymeric material as in this embodiment.

Embodiment 3

In this embodiment, a description is given on a light emitting device that includes an organic light emitting element according to the present invention. FIGS. 3(a) and 3(b) are sectional views of active matrix light emitting devices using organic light emitting elements of the present invention.

An active element here is a thin film transistor (hereinafter referred to as "TFT") but a MOS transistor may be used instead. The TFT in the examples shown here is a top gate TFT (planar TFT, to be specific). A bottom gate TFT (typically, a reverse stagger TFT) may also be used.

In FIG. 3(a), 301 denotes a substrate. Here, a substrate transmissive of visible light is employed since light is taken out from the substrate side. Specifically, a glass substrate, a quartz substrate, a crystallized glass substrate, or a plastic substrate (including a plastic film) may be used. The substrate 301 refers to the substrate plus an insulating film formed on its surface.

A pixel portion 311 and a driving circuit 312 are provided on the substrate 301. The pixel portion 311 will be described first.

The pixel portion 311 is a region for displaying an image. A plurality of pixels are on the substrate and each of the pixels has a TFT 302 for controlling a current that flows into an organic light emitting element (hereinafter referred to as "current controlling TFT"), a pixel electrode (anode) 303, an organic compound layer 304, and a cathode 305. Although the current controlling TFT is the only TFT shown in the pixel portion of FIG. 3(a), each pixel has a TFT for controlling the voltage applied to a gate of the current controlling TFT (hereinafter referred to as "switching TFT").

The current controlling TFT 302 here is preferably a p-channel TFT. It is possible to employ an n-channel TFT but a p-channel TFT can reduce power consumption more when the current controlling TFT is connected to the anode of the organic light emitting element as shown in FIGS. 3(a) and 3(b). The switching TFT may be an n-channel TFT or a p-channel TFT.

The pixel electrode 303 is electrically connected to a drain of the current controlling TFT 302. This embodiment uses a conductive material having a work function of 4.5 to 5.5 eV as the material of the pixel electrode 303. Therefore, the pixel electrode 303 functions as the anode of the organic light emitting element. A light-transmissive material, typically, indium oxide, tin oxide, or zinc oxide, or a compound of these (such as ITO) is used for the pixel electrode 303. The organic compound layer 304 is formed on the pixel electrode 303.

The cathode 305 is placed on the organic compound layer 304. The material of the cathode 305 is desirably a conductive material having a work function of 2.5 to 3.5 eV. Typically, a conductive film containing an alkaline metal element or alkaline earth metal element, or a conductive film containing aluminum is used for the cathode 305. Alternatively, a laminate obtained by layering an aluminum layer or silver layer on one of the above conductive films may be used.

A layer consisting of the pixel electrode 303, the organic compound layer 304, and the cathode 305 is covered with a protective film 306. The protective film 306 is provided to protect the organic light emitting element from oxygen and water. The material of the protective film 306 is silicon nitride, silicon oxynitride, aluminum oxide, tantalum oxide, or carbon (diamond-like carbon, to be specific).

The driving circuit 312 will be described next. The driving circuit 312 is a region for controlling timing of sending signals (gate signal and data signal) to the pixel portion 311, and is provided with a shift register, a buffer, a latch, and an analog switch (transfer gate) or a level shifter. The basic unit of these circuits in FIG. 3(a) is a CMOS circuit composed of an n-channel TFT 307 and a p-channel TFT 308.

Known circuit structures can be employed for the shift register, buffer, latch, and analog switch (transfer gate) or level shifter. The pixel portion 311 and the driving circuit 312 are on the same substrate in FIGS. 3(a) and 3(b), but an IC or LSI may be electrically connected instead of providing the driving circuit 312.

In FIGS. 3(a) and 3(b), the pixel electrode (anode) 303 is electrically connected to the current controlling TFT 302. However, the element may also take a structure in which the cathode is connected to the current controlling TFT. In this case, the pixel electrode is formed from the same material of the cathode 305 whereas the cathode is formed from the same material of the pixel electrode (anode) 303. Then, the current controlling TFT is preferably an n-channel TFT.

The light emitting device shown in FIG. 3(a) is manufactured by a process in which a wiring line 309 is formed after the pixel electrode 303 is formed. In this case, the surface of the pixel electrode 303 could be roughened. Since the organic light emitting element is a current driving type element, the roughened surface of the pixel electrode 303 can degrade the characteristics.

Then, the wiring line 309 may be formed before the pixel electrode 303 is formed to obtain a light emitting device shown in FIG. 3(b). This light emitting device is improved in terms of current injection from the pixel electrode 303 compared to the structure of FIG. 3(a).

In FIGS. 3(a) and 3(b), the pixels in the pixel portion 311 are separated from one another by a forward-tapered bank-like structure 310. If this bank-like structure is modified and tapered reversely, for example, it is possible to avoid contact between the bank-like structure and the pixel electrode. An example of this modification is shown in FIG. 4.

In FIG. 4, a wiring line doubles as a separator unit to provide a wiring line and a separator unit 310. The shape of the wiring line and the separator unit 310 shown in FIG. 4 (a structure with an eave) can be formed by etching a laminate of a metal film constituting the wiring line and a film of a material that is lower in etching rate than the metal (metal nitride, for example). This shape can prevent short circuit between the pixel electrode 303, or the wiring line, and the cathode 305. In FIG. 4, the cathode 305 on the pixel has a stripe pattern (similar to a cathode in a passive matrix device) unlike the usual active matrix light emitting device.

FIG. 5(a) shows an example of introducing to an active matrix light emitting device an electrode structure that is effective when a conductive polymeric material is used for a hole injection region. FIG. 5(a) is a sectional view thereof and FIG. 5(b) is a top view of the electrode structure in each pixel. In each pixel 513, instead of forming an anode on the entire surface, the anode has a stripe pattern. A slit is formed between stripe pattern electrodes 503.

If an organic compound layer is formed directly on this structure, a portion of the organic compound layer on a slit where no electrode is formed does not emit light. However, the entire surface of the pixel can emit light by coating this structure with a conductive polymeric material 514 as shown in FIG. 5(a). In short, the conductive polymeric material 514 serves as a hole injection region and an electrode at the same time.

A merit of the light emitting device of FIGS. 5(a) and 5(b) is that the anodes 503 do not need to be transparent. Enough light emitted can be taken out if the slits are provided such that the aperture ratio reaches 80 to 90%. Moreover, the conductive polymeric material 514 forms a flat surface, so that the electric field is uniformly applied to the organic compound layer and dielectric breakdown is prevented.

The exterior of the active matrix display device of FIG. 3(b) is shown in FIGS. 6(a) and 6(b). FIG. 6(a) is a top view thereof and FIG. 6(b) is a sectional view taken along the line P–P' of FIG. 6(a). The symbols in FIG. 3(b) are used in FIGS. 6(a) and 6(b).

In FIG. 6(a), 601 denotes a pixel portion, 602, a gate signal side driving circuit, and 603, a data signal side driving circuit. Signals to be sent to the gate signal side driving circuit 602 and the data signal side driving circuit 603 are inputted from a TAB (tape automated bonding) tape 605 through an input wiring line 604. Though not shown in the drawing, a TCP (tape carrier package) that is obtained by attaching an IC (integrated circuit) to a TAB tape may be connected instead of the TAB tape 605.

Denoted by 606 is a cover member, which is placed in an upper part of the light emitting device shown in FIG. 3(b). The cover member 606 is bonded using a seal member 607 that is formed of a resin. Any material can be used for the cover member 606 as long as it does not transmit oxygen and water. In this embodiment, the cover member 606 is composed of, as shown in FIG. 6(b), a plastic member 606a and carbon films (specifically, diamond-like carbon films) 606b and 606c that are formed on the front side and the back side of the plastic member 606a, respectively.

As shown in FIG. 6(b), the seal member 607 is covered with a sealing member 608 formed of a resin to completely seal the organic light emitting element in an air-tight space 609. The air-tight space 609 is filled with inert gas (typically nitrogen gas or noble gas), a resin, or an inert liquid (for example, liquid fluorocarbon represented by perfluoroalkane). It is also effective to put a moisture absorbing agent and an anti-oxidant in the space.

A polarizing plate may be provided on a display screen (on which an image is viewed) of the light emitting device shown in this embodiment. The polarizing plate has effects of reducing reflection of light entering from the outside and of preventing the display screen from reflecting an image of a viewer. A circular polarizing plate is used in general. However, it is preferred to adjust the refractive index and build a structure with less internal reflection in order to prevent light generated in the organic compound layer from being reflected by the polarizing plate and returning to the interior of the device.

Any of the organic light emitting elements according to the present invention can be used as the organic light emitting element included in the light emitting device of this embodiment.

Embodiment 4

This embodiment shows an active matrix light emitting device as an example of light emitting device that includes an organic light emitting element according to the present invention. Unlike Embodiment 5, the light emitting device shown in this embodiment has a structure in which light is taken out from the opposite side of the substrate having an active element formed thereon (hereinafter referred to as "upward emission"). FIG. 7 shows a sectional view thereof.

An active element here is a thin film transistor (hereinafter referred to as "TFT") but a MOS transistor may be used instead. The TFT in the example shown here is a top gate TFT (planar TFT, to be specific). A bottom gate TFT (typically, a reverse stagger TFT) may also be used.

In this embodiment, a substrate 701, a current controlling TFT 702 formed in the pixel portion, and a driving circuit 712 may have the same structures as those in Embodiment 4.

A first electrode 703 connected to a drain of the current controlling TFT 702 is used as an anode in this embodiment, and therefore a conductive material having a large work function is used for the electrode. Typical examples of the conductive material include metals such as nickel, palladium, tungsten, gold, and silver. In this embodiment, the first electrode 703 preferably does not transmit light and, more preferably, is highly reflective of light as well.

An organic compound layer 704 is provided on the first electrode 703. Formed on the organic compound layer 704 is a second electrode 705, which serves as a cathode in this embodiment. The material of the second electrode 705 serving as a cathode is desirably a conductive material having a work function of 2.5 to 3.5 eV. Typically, a conductive film containing an alkaline metal element or alkaline earth metal element, or a conductive film containing aluminum is used for the electrode. Alternatively, a laminate obtained by layering an aluminum layer or a silver layer on one of the above conductive films may be used. However, the second electrode 705 has to be transmissive of light since the device of this embodiment emits light upward. Therefore, a metal chosen from those described above is formed into a very thin film, preferably about 20 nm in thickness.

A layer consisting of the first electrode 703, the organic compound layer 704, and the second electrode 705 is covered with a protective film 706. The protective film 706 is provided to protect the organic light emitting element from oxygen and water. In this embodiment, any material can be used for the protective film as long as it transmits light.

In FIG. 7, the first electrode (anode) 703 is electrically connected to the current controlling TFT 702. However, the element may also take a structure in which the cathode is connected to the current controlling TFT. In this case, the first electrode is formed from the material of the cathode whereas the second electrode is formed from the material of the anode. Then the current controlling TFT is preferably an n-channel TFT.

Denoted by 707 is a cover member, which is bonded using a seal member 708 that is formed of a resin. Any material can be used for the cover member 707 as long as it does not transmit oxygen and water and can transmit light. Glass is used in this embodiment. An air-tight space 709 is filled with inert gas (typically, nitrogen gas or noble gas), a resin, or an inert liquid (for example, liquid fluorocarbon represented by perfluoroalkane). It is also effective to put a moisture absorbing agent and an anti-oxidant in the space.

Signals to be sent to the gate signal side driving circuit and the data signal side driving circuit are inputted from a TAB (Tape Automated Bonding) tape 714 through an input wiring line 713. Though not shown in the drawing, a TCP (tape carrier package) that is obtained by attaching an IC (integrated circuit) to a TAB tape may be connected instead of the TAB tape 714.

A polarizing plate may be provided on a display screen (on which an image is viewed) of the light emitting device shown in this embodiment. The polarizing plate has effects of reducing reflection of light entering from the outside and of preventing the display screen from reflecting an image of a viewer. A circular polarizing plate is used in general. However, it is preferred to adjust the refractive index and build a structure with less internal reflection in order to prevent light generated in the organic compound layer from being reflected by the polarizing plate and returning to the interior of the device.

Any of the organic light emitting elements according to the present invention can be used as the organic light emitting element included in the light emitting device of this embodiment.

Embodiment 5

This embodiment shows a passive matrix light emitting device as an example of light emitting device that includes an organic light emitting element according to the present invention. FIG. 8(a) shows a top view thereof and FIG. 8(b) shows a sectional view taken along the line P–P' of FIG. 8(a).

In FIG. 8(a), 801 is a base plate, which is a plastic material here. As the plastic material, polyimides, polyamides, acrylic resins, epoxy resins, PESs (polyethersulfones), PCs (polycarbonates), PETs (polyethylene terephthalates), or PENs (polyethernitriles) which are in the shape of a sheet or a film can be used.

Symbol 802 denotes scanning lines (anodes) formed from a conductive oxide film. The conductive oxide film used in this embodiment is obtained by doping zinc oxide with gallium oxide. Denoted by 803 are data lines (cathodes) formed from a metal film, a bismuth film, in this embodiment. 804 denotes a bank formed of an acrylic resin. The bank 804 functions as a partition wall for separating the data lines 803 from one another. The scanning lines 802 and the data lines 803 each form a stripe pattern and the two patterns are arranged so as to cross at right angles. Though not shown in FIG. 8(a), organic compound layers are sandwiched between the scanning lines 802 and the data lines 803, and intersections 805 each make a pixel.

The scanning lines 802 and the data lines 803 are connected to external driving circuits through a TAB tape 807. 808 denotes a group of wiring lines that is a mass of the scanning lines 802. 809 denotes a group of wiring lines that is a mass of connection wiring lines 806 connected to the data lines 803. Though not shown, a TCP obtained by attaching an IC to a TAB tape may be connected instead of the TAB tape 807.

In FIG. 8(b), 810 denotes a seal member, and 811 denotes a cover member bonded to a plastic member 801 by the seal member 810. The seal member 810 is desirably formed of a low-hygroscopic material that allows little gas to leak, and a photo-curable resin is appropriate. The cover member is preferably the same material as the substrate 801, and may be formed of glass (including quartz glass) or plastic. A plastic material is used here.

An enlarged view of the structure of the pixel region is shown in FIG. 8(c). 813 denotes the organic compound layers. As shown in FIG. 8(c), the bank 804 is narrower in its lower layer than its upper layer to physically separate the data lines 803 from one another. A pixel portion 814 surrounded by the seal member 810 is cut off from the outside air by a sealing member 815 that is formed of a resin to prevent degradation of the organic compound layers.

Structured as above, the light emitting device of the present invention has the pixel portion 814 composed of the scanning lines 802, the data lines 803, the bank 804, and the organic compound layers 813 and therefore can be manufactured by a very simple process.

A polarizing plate may be provided on a display screen (on which an image is viewed) of the light emitting device shown in this embodiment. The polarizing plate has effects of reducing reflection of light entering from the outside and of preventing the display screen from reflecting an image of a viewer. A circular polarizing plate is used in general. However, it is preferred to adjust the refractive index and build a structure with less internal reflection in order to prevent light generated in the organic compound layer from being reflected by the polarizing plate and returning to the interior of the device.

Any of the organic light emitting elements according to the present invention can be used as the organic light emitting element included in the light emitting device of this embodiment.

Embodiment 6

This embodiment shows an example of attaching a printed wiring board to the light emitting device shown in Embodiment 5 to make the device into a module.

In a module shown in FIG. 9(a), a TAB tape 904 is attached to a substrate 901 (here, including a pixel portion 902 and wiring lines 903a and 903b), and a printed wiring board 905 is attached to the substrate 901 through the TAB tape 904.

A functional block diagram of the printed wiring board 905 is shown in FIG. 9(b). At least, ICs functioning as I/O ports (input or output portions) 906 and 909, a data signal side driving circuit 907, and a gate signal side driving circuit 908 are provided within the printed wiring board 905.

In this specification, a module structured by attaching a TAB tape to a substrate with a pixel portion formed on its surface and by attaching a printed wiring board that functions as a driving circuit to the substrate through the TAB tape as above is particularly called a module with external driving circuit.

Any of the organic light emitting elements according to the present invention can be used as the organic light emitting element included in the light emitting device of this embodiment.

Embodiment 7

This embodiment shows an example of attaching a printed wiring board to the light emitting device shown in Embodiment 3, 4 or 5 to make the device into a module.

In a module shown in FIG. 10(a), a TAB tape 1004 is attached to a substrate 1001 (here, including a pixel portion 1002, data signal side driving circuit 1003, gate signal side driving circuit 1004 and wiring lines 1003a and 1003b), and a printed wiring board 1006 is attached to the substrate through the TAB tape 1005. A functional block diagram of the printed wiring board 1006 is shown in FIG. 10(b).

As shown in FIG. 10(b), at least ICs functioning as I/O ports 1007 and 1010, and a control unit 1008 are provided within the printed wiring board 1006. Further, though a memory unit 1009 is provided here, the memory unit is not necessarily needed. Also, the control unit 1008 is a unit, which has a function to control, for example, a driving circuit and correction of video data.

In this specification, a module structured by attaching a printed wiring board that has functions as a controller to a substrate on which an organic light emitting element is formed as described above is particularly called a module with external controller.

Any of the organic light emitting elements according to the present invention can be used as the organic light emitting element included in the light emitting device of this embodiment.

Embodiment 8

This embodiment shows an example of a light emitting device in which an organic light emitting element is driven in accordance with digital time gray scale display. The light emitting device of this embodiment can provide uniform images by digital time gray scale display and therefore is very useful.

FIG. 11(a) shows the circuit structure of a pixel that uses an organic light emitting element. Tr represents a transistor and Cs represents a storage capacitor. In this circuit, when a gate line is selected, a current flows into Tr1 from a source line and a voltage corresponding to the signal is accumulated in Cs. Then, a current that is controlled by the gate-source voltage (Vgs) of Tr2 flows into Tr2 and the organic light emitting element.

After Tr1 is selected, Tr1 is turned OFF to hold the voltage (Vgs) of Cs. Accordingly, a current continues to flow in an amount dependent of Vgs.

FIG. 22(b) shows a chart for driving this circuit in accordance with digital time gray scale display. In digital time gray scale display, one frame is divided into plural sub-frames. FIG. 11(b) shows 6 bit gray scale in which one frame is divided into six sub-frames. In this case, the ratio of light emission periods of the sub-frames is 32:16:8:4:2:1.

FIG. 11(c) schematically shows driving circuits of the TFT substrate in this embodiment. A gate driver and a source driver are provided on the same substrate. In this embodiment, the pixel circuit and the drivers are designed to be digitally driven. Accordingly, fluctuation in TFT characteristics does not affect the device and the device can display uniform images.

Embodiment 9

The light emitting devices of the present invention which have been described in the embodiments above have advantages of low power consumption and inexpensiveness. Accordingly, electric appliances that include those light emitting devices as their display units etc. can operate consuming less power than conventional ones and can be provided at lower cost. The advantages are very useful especially for electric appliances that use batteries as power sources, such as portable equipment, because low power consumption leads directly to conveniences (batteries last longer).

The light emitting device is self-luminous, whereby the need for backlight like the one in liquid crystal displays is eliminated. The device has an organic compound layer whose thickness is less than 1 μm. Therefore the light emitting device can be made thin and light-weight. Electric appliances that include the light emitting device as their display units are accordingly thinner and lighter than conventional ones. This too leads directly to conveniences (lightness and compactness in carrying them around) and is very useful particularly for portable equipment and like other electric appliances. Moreover, being thin (unvoluminous) is doubtlessly useful for all of the electric appliances in terms of transportation (a large number of appliances can be transported in a mass) and installation (space-saving).

Being self-luminous, the light emitting device is characterized by having better visibility in bright places and wide viewing angle than liquid crystal display devices. Therefore electric appliances that include the light emitting device as their display units are advantageous also in terms of easiness in viewing display.

To summarize, electric appliances that use a light emitting device of the present invention have, in addition to merits of conventional organic light emitting elements, namely, thinness/lightness and high visibility, new features of low power consumption and low cost, and therefore are very useful.

This embodiment shows examples of the electric appliances that include as display units the light emitting device of the present invention. Specific examples thereof are shown in FIGS. 12 and 13. The organic light emitting element included in the electric appliance of this embodiment can be any of the elements according to the present invention. The light emitting device included in the electric appliance of this embodiment can have any of the configurations illustrated in FIGS. 3 to 11.

FIG. 12(a) shows a display using an organic light emitting element. The display includes a case 1201a, a support base 1202a, and a display unit 1203a. By using the light emitting device of the present invention as the display unit 1203a, the display can be thin and light-weight, as well as inexpensive. Accordingly, transportation is simplified, space is saved in installation, and the cost can be suppressed.

FIG. 12(b) shows a video camera, which includes a main body 1201b, a display unit 1202b, a voice input unit 1203b, operational switches 1204b, a battery 1205b, and an image receiving unit 1206b. By using the light emitting device of the present invention as the display unit 1202b, the video camera consumes less power and can be light-weight. Therefore, the battery consumption decreases and carrying thereof also becomes easier.

FIG. 12(c) shows a digital camera, which includes a main body 1201c, a display unit 1202c, a viewfinder 1203c, and operational switches 1204c. By using the light emitting device of the present invention as the display unit 1202c, the digital camera consumes less power and can be light-weight. Therefore, the battery consumption decreases and carrying thereof also becomes easier.

FIG. 12(d) shows an image reproducing device equipped with a recording medium. The device includes of a main body 1201d, a recording medium (such as CD, LD, or DVD) 1202d, operational switches 1203d, a display unit (A) 1204d, and a display unit (B) 1205d. The display unit (A) 1204d mainly displays image information whereas the display unit (B) 1205d mainly displays text information. By using the light emitting device of the present invention as the display unit (A) 1204d and the display unit (B) 1205d, the image reproducing device consumes less power and can be light-weight as well as inexpensive. This image reproducing device equipped with a recording medium may be a CD player, a game machine, or the like.

FIG. 12(e) shows a mobile computer, which includes a main body 1201e, a display unit 1202e, an image receiving unit 1203e, operational switches 1204e, and a memory slot 1205e. By using the light emitting device of the present invention as the display unit 1202e, the mobile computer consumes less power and can be thin and light weight. Therefore, the battery consumption decreases and carrying thereof also becomes easier. This mobile computer has a recording medium with a flash memory and a non-volatile memory integrated thereon, which can record and playback information.

FIG. 128(f) shows a personal computer, which includes a main body 1201f, a frame 1202f, a display unit 1203f, and a keyboard 1204f. By using the light emitting device of the present invention as the display unit 1203f, the personal computer consumes less power and can be thin and light-weight. When it is to be used as a mobile computer, that is, when there is a need to carry it, the low power consumption and the lightness will be of great advantage.

Note that the above electric appliances display information distributed through electronic communication lines such as the Internet or radio communication such as electric wave in many cases, and, in particular, display animated information with increasing frequency. Because organic light emitting elements have very fast response speed, the above electric appliances are preferable for such animated display.

FIG. 13A shows a mobile phone, which includes a main body 1301a, an audio output unit 1302a, an audio input unit 1303a, a display unit 1304a, operational switches 1305a, and an antenna 1306a. By using the light emitting device of the present invention as the display unit 1304a, the mobile phone consumes less power and can be thin and light-weight. Therefore, the main body becomes compact, the battery consumption decreases, and carrying thereof also becomes easier.

FIG. 13B is an audio playback device, (specifically a car audio system), which includes a main body 1301 b, a display unit 1302b, and operational switches 1303b, and 1304b. By using the light emitting device of the present invention as the display unit 1302b, the audio playback device consumes less power and can be light-weight. Although car audio is taken as an example in this embodiment, it may also be a home audio system.

In the electric appliances as shown in FIGS. 12 to 13, it is effective to give a function for modulating the luminance of emitted light in accordance with brightness of the usage environment by further building-in an optical sensor and thus providing means for detecting brightness of the usage environment. If the user can ensure the brightness of 100 to 150 in contrast ratio in comparison with the brightness of the usage environment, an image or text information can be recognized without difficulty. Namely, when the environment is bright, the luminance of an image is raised so that the image can easily be viewed, while when the environment is dark, the luminance of the image is suppressed so as to lower the power consumption.

Further, various electric appliances using the light emitting device of the present invention as a light source can also operate at a low power consumption and be thin and light-weight and therefore can be said to be very useful. Typically, an electric appliance including the light emitting device of the present invention as a light source such as a back light or a front light of the liquid crystal display device, or as a light source of lighting fixture can realize a low power consumption and be thin and light-weight.

Accordingly, in the case where the display portion of the each electric appliance shown in FIGS. 12 to 13 according to the present embodiment is a liquid crystal display, an electric appliance using the light emitting device of the present invention as a back light or a front light of the liquid crystal display is manufactured, whereby a light-weight and thin electric appliance which consumes less power can be realized.

A light emitting device which consumes less power and which is inexpensive can be obtained by carrying out the present invention. Moreover, using this light emitting device for a light source or a display unit provides an electric appliance which is bright but consumes less power and which is inexpensive.

What is claimed is:
1. An organic light emitting element, comprising:
   an anode;
   a cathode; and
   a light emitting organic compound layer between the anode and the cathode,
   wherein the light emitting organic compound layer is a metal complex essentially consisting of at least a chelate ligand expressed by the following general formula (1) and tungsten as a central metal,

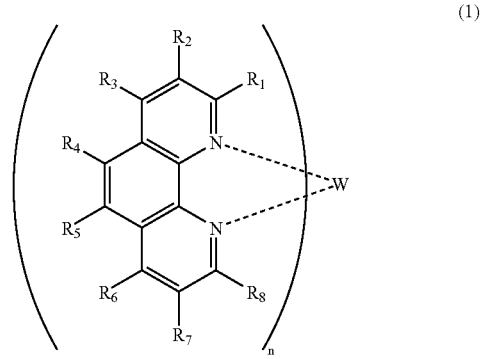

(1)

wherein R1 to R8 each represents one of a hydrogen atom, a halogen atom, an alkyl group, an alkoxyl group, and an aryl group, and n represents an integer ranging from 1 to 4.

2. An organic light emitting element according to claim 1, wherein the tungsten contained in the metal complex is zero-valent.

3. A light emitting device comprising the organic light emitting element according to claim 1.

4. An electric appliance comprising the light emitting device according to claim 3.

5. An organic light emitting element, comprising:
   an anode;
   a cathode; and
   a light emitting organic compound layer between the anode and the cathode,
   wherein the light emitting organic compound layer is a metal complex essentially consisting of at least a chelate ligand expressed by the following general formula (2) and tungsten as a central metal,

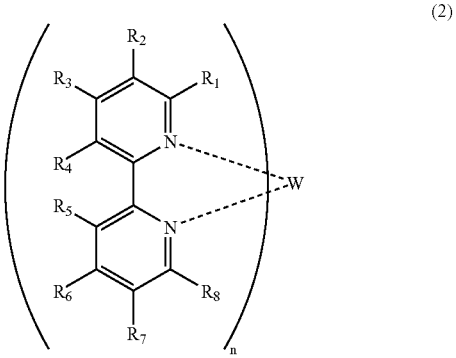

(2)

wherein R1 to R8 each represents one of a hydrogen atom, a halogen atom, an alkyl group, an alkoxyl group, and an aryl group, and n represents an integer ranging from 1 to 4.

6. An organic light emitting element according to claim 5, wherein the tungsten contained in the metal complex is zero-valent.

7. A light emitting device comprising the organic light emitting element according to claim 5.

8. An electric appliance comprising the light emitting device of claim 7.

* * * * *